(12) United States Patent
Parpia et al.

(10) Patent No.: US 8,704,549 B1
(45) Date of Patent: Apr. 22, 2014

(54) PROGRAMMABLE INTEGRATED CIRCUITS WITH DECOUPLING CAPACITOR CIRCUITRY

(75) Inventors: Zahir Parpia, Toronto (CA); Chris Wysocki, Toronto (CA)

(73) Assignee: Altera Corporation, San Jose, CA (US)

( * ) Notice: Subject to any disclaimer, the term of this patent is extended or adjusted under 35 U.S.C. 154(b) by 14 days.

(21) Appl. No.: 13/464,869

(22) Filed: May 4, 2012

(51) Int. Cl.
*H03K 19/173* (2006.01)

(52) U.S. Cl.
USPC .......................... 326/49; 326/101; 361/306.1

(58) Field of Classification Search
USPC ................. 326/37–49, 101; 361/306.1, 306.2
See application file for complete search history.

(56) References Cited

U.S. PATENT DOCUMENTS

| | | | | |
|---|---|---|---|---|
| 7,262,951 B2* | 8/2007 | Hou et al. | .................. | 361/306.2 |
| 7,498,835 B1* | 3/2009 | Rahman et al. | .................. | 326/38 |
| 8,161,442 B2* | 4/2012 | McElvain et al. | ............. | 716/115 |
| 2008/0076229 A1* | 3/2008 | Mao et al. | ...................... | 438/381 |

OTHER PUBLICATIONS

Khor et al., U.S. Appl. No. 13/175,724, filed Jul. 1, 2011.
Smeys et al., U.S. Appl. No. 13/345,630, filed Jan. 6, 2012.
Wong et al., U.S. Appl. No. 12/909,739, filed Oct. 21, 2010.
Mezhiba et al., "Scaling trends of on-chip power distribution noise" IEEE Trans. Very Large Scale Integr. (VLSI) Syst., vol. 12, No. 4, pp. 386-394, Apr. 2004.
Eom et al., "On-Chip Supply Noise Regulation Using a Low-Power Digital Switched Decoupling Capacitor Circuit", IEEE Journal of Solid-State Circuits, vol. 44, No. 6, Jun. 2009.
Salem et al., "An On-Chip Voltage Regulator Using Switched Decoupling Capacitors", IEEE International Solid-State Circuits Conference Dig. Tech. Papers, 2000, pp. 438-439.

* cited by examiner

*Primary Examiner* — James H Cho
(74) *Attorney, Agent, or Firm* — Treyz Law Group; Jason Tsai

(57) ABSTRACT

Programmable integrated circuits with configurable logic circuitry and routing resources are provided. Portions of the routing resources on a programmable integrated circuit may be used in implementing a desired user-specified custom logic function, whereas other portions of the routing resources on the programmable integrated circuit may be unused. The unused routing resources may include adjacent pairs of routing paths. These paths may be coupled to control circuitry configured to drive the routing paths to desired voltage levels to provide an optimal amount of decoupling capacitance. In one suitable arrangement, two adjacent routing paths may both be driven to a positive power supply voltage level. In another suitable arrangement, the two adjacent routing paths may be driven to the positive power supply voltage level and a ground power supply voltage level, respectively.

20 Claims, 12 Drawing Sheets

PROGRAMMABLE INTEGRATED CIRCUITS WITH DECOUPLING CAPACITOR CIRCUITRY

BACKGROUND

This relates generally to integrated circuits, and more particularly, to programmable integrated circuits with decoupling capacitors.

Programmable integrated circuits are a type of integrated circuit that can be programmed by a user to implement a desired custom logic function. In a typical scenario, a logic designer uses computer-aided design (CAD) tools to design a custom logic circuit. When the design process is complete, the tools generate configuration data. The configuration data is loaded into memory elements (sometimes referred to as configuration memory cells) to configure the device to perform the functions of the custom logic.

During normal operation of a programmable device, loaded configuration memory cells produce static output signals that are applied to the gates of transistors (i.e., pass transistors). The configuration memory cell output signals turn some pass transistors on and turn other pass transistors off. This selective activation of pass transistors on the programmable device customizes the operation of the device so that the device performs its intended function.

Programmable integrated circuits typically include decoupling capacitors. Decoupling capacitors are used to help provide more stable power supply voltages by shunting high frequency noise on direct current (DC) power supply lines to ground, thereby preventing the noise from reaching powered circuit components. In a scenario in which a power supply is required to switch between various modes of operation, an adequate decoupling capacitance can act as an energy reserve that lessens the magnitude of undesired dips in power supply voltage during mode switching events.

To ensure that a wide range of logic functions can be implemented, programmable integrated circuits are equipped with large amounts of configurable resources sufficient to implement any desired custom logic functions for a vast majority of users. As a result, programmable integrated circuits often include unused resources such as unused routing paths, memory cells, and other switching circuits. Conventionally, these unused routing paths are driven to a positive power supply voltage level. Each unused routing path that is driven as such will exhibit a parasitic capacitance to ground. Parasitic capacitance generated in this way provides additional decoupling capacitance for the programmable integrated circuit.

Advances in integrated circuit design require power supplies to supply stable power for integrated circuits operating at high data rates and clock speeds. This requires increasing amounts of decoupling capacitance per integrated circuit area. Decoupling capacitance provided by driving the unused routing paths to only the positive power supply voltage level may not be sufficient. Additional decoupling capacitor circuitry could occupy a disproportionate amount of valuable surface area on the programmable device.

SUMMARY

Programmable integrated circuits may include configurable elements and routing resources that are used to implement desired custom logic functions. When implementing a user-specified custom logic function with a programmable integrated circuit, at least a portion of its configurable resources will be unused (e.g., idle). Unutilized resources may include programmable routing paths (as an example).

The unused routing paths may be configured to provide additional decoupling capacitance for the programmable integrated circuit. For example, consider a scenario in which first and second unused routing paths are formed adjacent to each other. In one suitable arrangement, the first and second routing paths may be driven to a positive power supply voltage level and a ground power supply voltage level, respectively. In another suitable arrangement, the first and second routing paths may each be driven to the positive power supply voltage level. Computer-aided design tools implemented on computing equipment may be used to determine how to properly bias each adjacent pair of unused routing path to achieve optimal capacitance.

Each routing path may be coupled to a respective multiplexing circuit (e.g., the first routing path may be coupled to a first multiplexer, whereas the second routing path may be coupled to a second multiplexer). One way of driving these routing paths to desired voltage levels is to have dedicated multiplexer inputs that are coupled to positive and/or ground power supply lines. Each multiplexer may then be configured to couple at least one of the dedicated inputs to its output for driving the corresponding routing path to the desired biasing level. Another way is to generate desired data signals and for the multiplexers to pass these data signals to the unused routing paths. Another way is to include reset and keeper circuitry operable to drive the routing paths to a desired default state upon device startup. If desired, any combination of suitable techniques may be used in driving the unused routing paths to desired voltage levels.

The decoupling capacitance provided in this way may help to reduce the amount of power supply noise present on power supply lines. The programmable integrated circuit may also include other decoupling capacitor structures that are organized in groups of decoupling capacitor blocks. The decoupling capacitors in each block may be arranged in an array with multiple rows and columns of decoupling capacitors. The decoupling capacitor blocks may have different sizes and shapes and may exhibit different capacitance values.

Further features of the present invention, its nature and various advantages will be more apparent from the accompanying drawings and the following detailed description.

DETAILED DESCRIPTION

Figure 1:
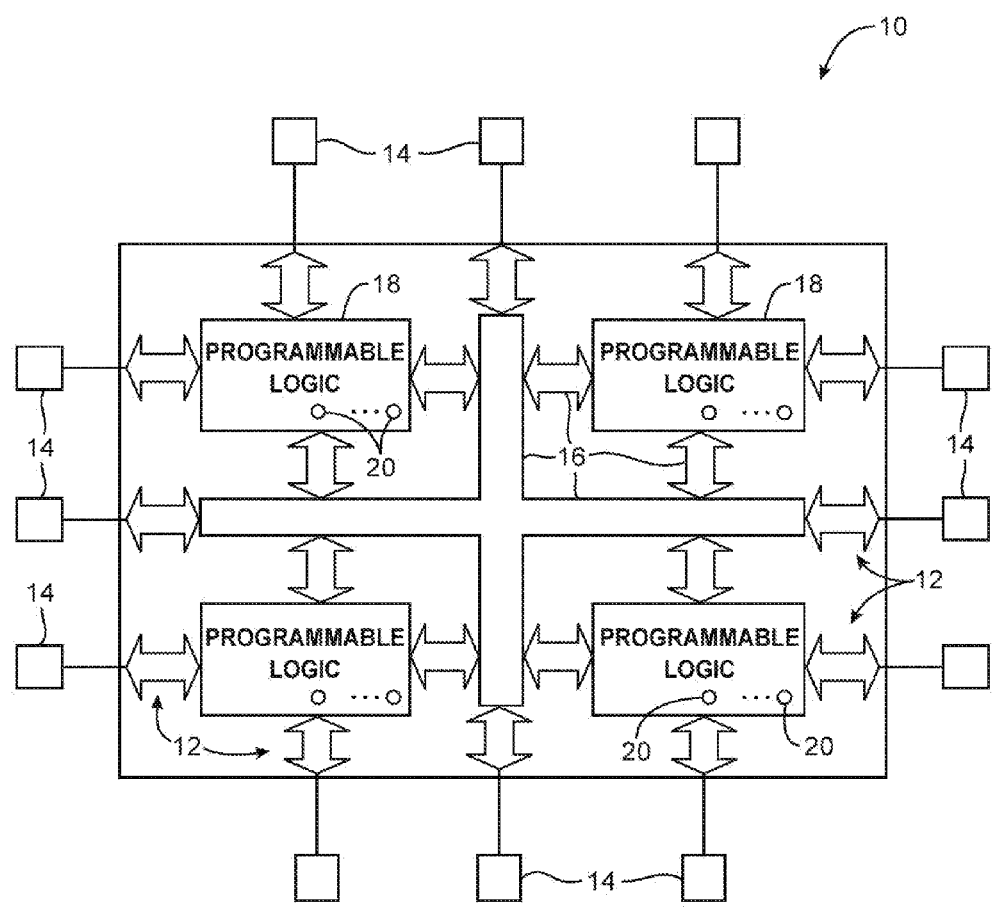
FIG. 1 is a diagram of an illustrative programmable integrated circuit in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit.

As shown in FIG. 1, programmable integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, NAND gates, etc. P-channel transistors (e.g., a p-channel metal-oxide-semiconductor pass transistor) may also be controlled by output signals from memory elements 20, if desired. When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

Figure 2:
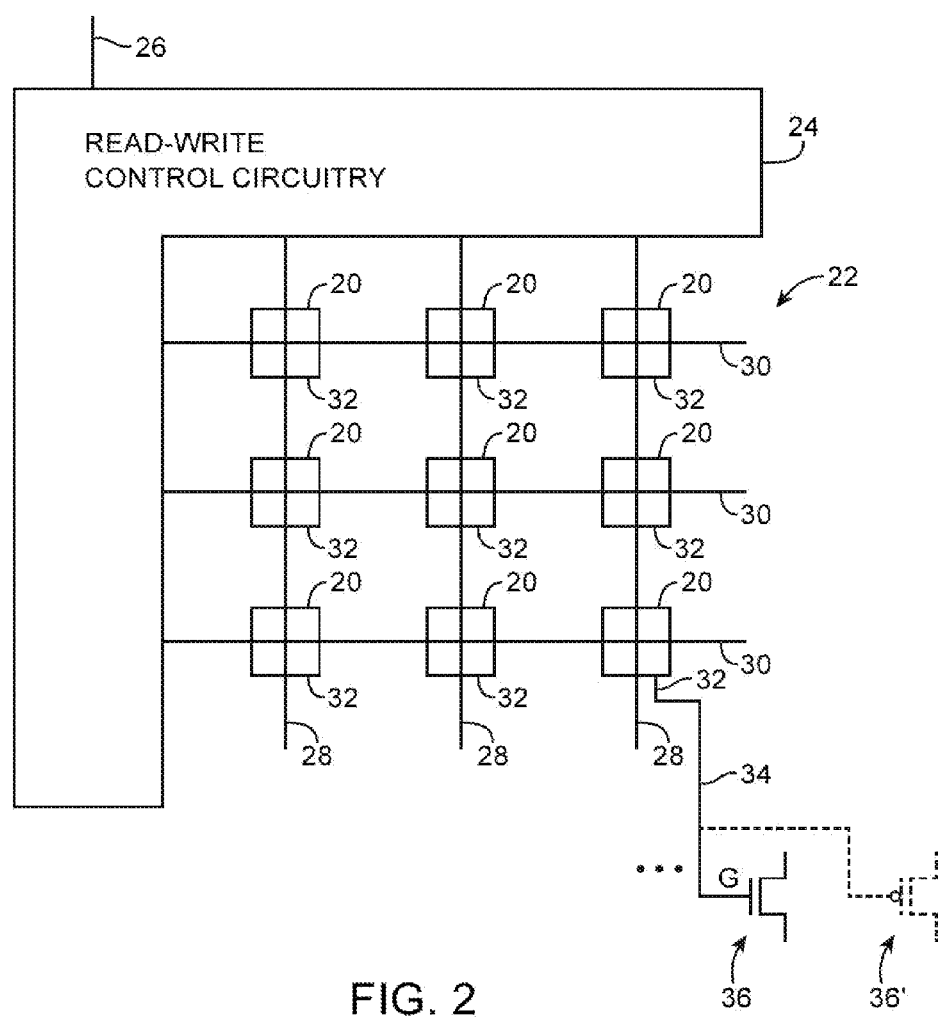
FIG. 2 is a diagram of illustrative memory circuitry in accordance with an embodiment of the present invention.

Horizontal and vertical conductive lines and associated control circuitry may be used to write data into the memory elements and may be used to read data from the memory elements. An illustrative arrangement that allows data to be written into and read from an array of memory elements is shown in FIG. 2. Illustrative array 22 of FIG. 2 has memory elements 20. Memory elements 20 may be volatile memory elements such as CRAM cells. Each memory element 20 may have a corresponding output 32 with which a corresponding static output signal may be applied to the gate of a corresponding programmable transistor. For example, a path such as path 34 may be used to apply an output signal from the output 32 of a memory element 20 to a gate G of a corresponding programmable transistor (pass gate) such as pass gate 36. The programmable transistor may be an n-channel metal-oxide-semiconductor transistor such as transistor 36 of FIG. 2 or may be a p-channel metal-oxide-semiconductor transistor (see illustrative pass gate 36' of FIG. 2).

The arrangement of FIG. 2 has a 3×3 array 22 of memory elements 20. Device 10 may, if desired have more rows and columns (e.g., hundreds or thousands of rows and columns). A 3×3 array of FIG. 2 is merely illustrative and does not serve to limit the scope of the present invention.

Read-write control circuitry 24 may obtain data to be loaded into array 22 via path 26. Data that has been read from array 22 may be provided to path 26 from memory elements 20 by read-write control circuitry 24.

Control signals on one or more control lines 30 may be used to control reading and writing operations. For example, during writing and reading operations, signals on address lines in lines 30 (sometimes referred to as word lines) may be asserted to control associated address transistors. If desired, control lines 30 may include clear lines. A clear signal may be asserted on the clear lines when it is desired to clear the contents of the memory elements 20 in array 22 (e.g., when it is desired to clear all of the memory elements in a block of memory elements simultaneously).

Data lines 28 (sometimes referred to as bit lines) may be used in conveying data from read-write control circuitry 24 to memory elements 20 during data loading operations. Data lines 28 may also be used in conveying data from memory elements 20 to read-write control circuitry 24 during data reading operations. The memory elements that are selected during reading and writing operations may be controlled by the address lines (lines 30).

There may be any suitable number of address lines and data lines associated with each memory element 20. For example, each memory element in a row of memory elements may be associated with a single address line that is used for controlling both reading and writing operations or may be associated with a write address line for use during write operations and a read address lines for use during read operations. One data line may be associated with each memory element in a column of memory elements or a pair of complementary data lines may be associated with each memory element in a column of memory elements (as examples).

Figure 3:
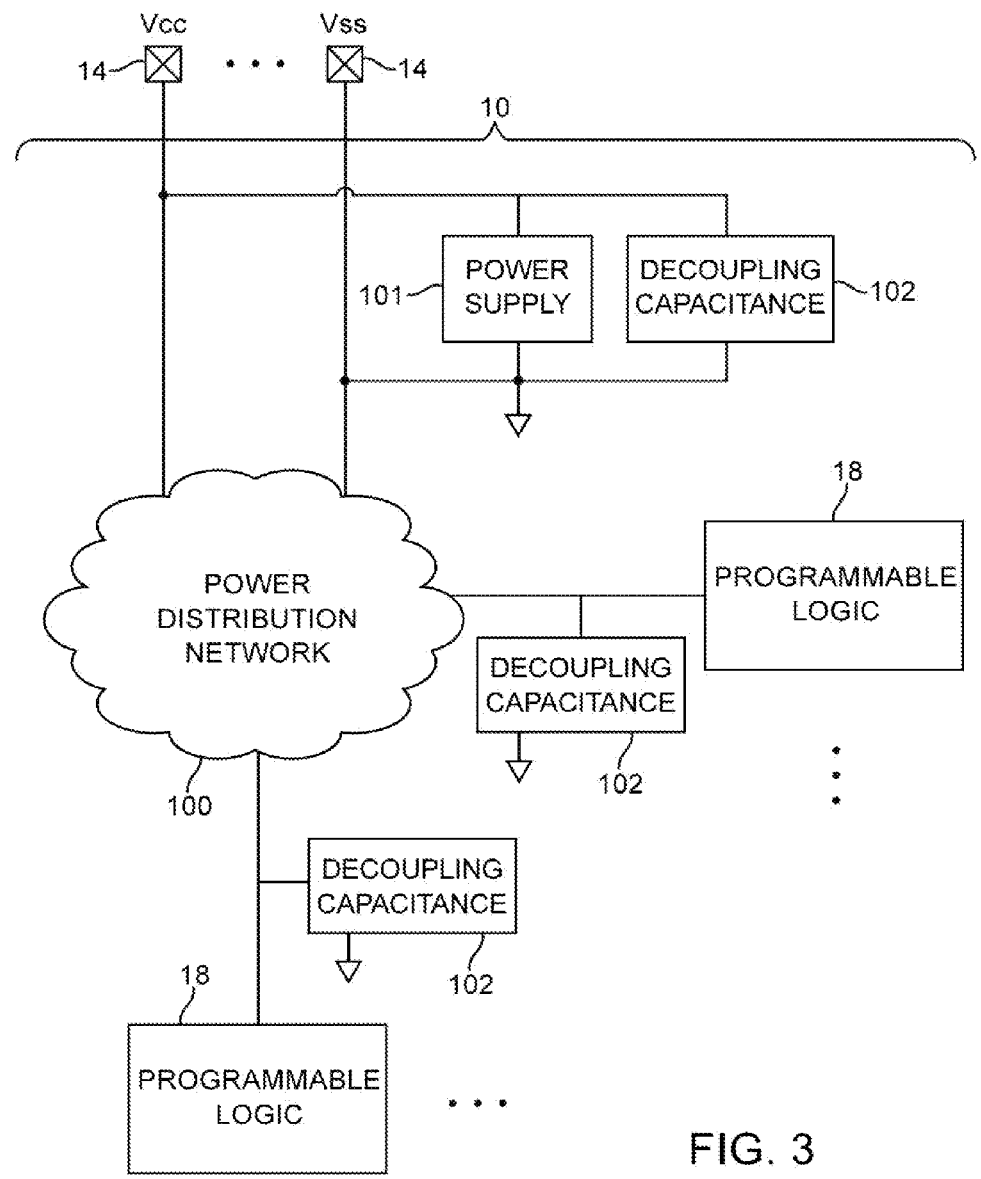
FIG. 3 is a diagram of an illustrative programmable integrated circuit having decoupling capacitor circuitry in accordance with an embodiment of the present invention.

FIG. 3 is a diagram showing how power may be supplied to different parts of programmable integrated circuit 10. As shown in FIG. 3, a power supply voltage such as positive power supply voltage Vcc and ground power supply Vss that are received externally through at least two of input-output pins 14 may be distributed to different logic regions (e.g., Vcc and Vss may be supplied to programmable logic 18 located at respective regions) on device 10 via a power distribution network such as power distribution network 100. Network 100 may include vertical and horizontal conductive routing paths that span substantially all of device 10 or only part of device 10. Network 100 may be arranged in a tree configuration. Network 100 may, for example, be an H-tree power distribution network optimized to provide power to various portions of device 10 while minimizing IR (voltage) drop. Ground power supply voltage Vss and other suitable externally-applied voltage signals (i.e., biasing signals received via pins 14) or internally-generated voltage signals (i.e., biasing signals generated on-chip using voltage regulators) may also be distributed using this approach.

It is generally desirable to maintain the power supply voltages at constant voltage levels (e.g., to minimize power supply voltage variation). The amount of power drawn from the power supply may vary during normal operation of an integrated circuit. To accommodate this type of changing power demand while maintaining constant power supply voltage levels, device 10 may include decoupling capacitor circuitry. The decoupling capacitor circuitry may serve as a local energy storage reserve that provides instantaneous current draw. Providing current using the decoupling capacitor circuitry may reduce power supply noise.

As shown in FIG. 3, device 10 may include blocks of decoupling capacitors such as decoupling capacitor blocks 102. Decoupling capacitor 102 may be coupled between positive and ground power supply lines and may be coupled in parallel with power supply terminals associated with power supply circuitry 101. Decoupling capacitor blocks 102 may each include an array of decoupling capacitors and other capacitive structures. Decoupling capacitor blocks 102 of varying configurations (e.g., decoupling capacitor blocks 102 of different sizes and shapes) may be formed on device 10. Decoupling capacitor blocks 102 may also be formed from combinations of different types of capacitors (e.g. thin oxide capacitors and thick oxide capacitors), if desired. Decoupling capacitance 102 may be formed at many locations (e.g., adjacent to the I/O circuitry, at various branches of power distribution network 100, adjacent to logic circuits 18 that are sensitive to power supply variation, or at any desired location on device 10). Tens or hundreds of decoupling capacitor array blocks 102 may be formed on device 10, if desired.

Decoupling capacitance (sometimes abbreviated as "decap") 102 may serve to reduce power supply variation at the respective locations on device 10. For example, consider a scenario in which an external power source supplies a 1.2 V positive power supply voltage to device 10. Device 10 may include communications circuitry operating at high data rates (e.g., data rates greater than 1 Gbps).

During an idle mode, the communications circuitry may draw 0.5 A of current from the power source (as an example). During transmit mode, the communications circuitry may draw 0.7 A of current from the power source. During the switching operations from the idle mode to the transmit mode, decoupling capacitance 102 located adjacent to the communications circuitry on device 10 may serve to provide 0.2 A of current (0.7-0.5) so that the communications circuitry receives a constant positive supply voltage of 1.2 V.

Consider another scenario in which the positive power supply experiences an instantaneous voltage glitch. Decoupling capacitor blocks 102 may dampen or absorb this glitch by providing instantaneous current to internal circuitry so that the positive power supply voltage received at the local power supply terminal of the internal circuitry remains constant at 1.2 V (as an example). Decoupling capacitor circuitry used to maintain constant power supply voltage while supplying the desired current draw may sometimes be referred to as a ballasting circuit.

Decoupling capacitors 102 formed on device 10 may have large dimensions. For example, a single decoupling capacitor array 102 may measure 400 µm by 200 µm and may have one hundred or more, one thousand or more, or ten thousand or more individual capacitor cells. The size of decoupling capacitor circuitry 102 in modern integrated circuits may occupy a significant percentage of the available die area (e.g., from three to fifteen percent or more).

Programmable integrated circuits 10 may include a large amount of configurable resources such as programmable routing paths 16 and programmable logic components (e.g., pass transistors, multiplexing circuits, configuration memory cells, etc.) for accommodating a wide range of desired logic functions. Generally, only a portion of the total available programmable resources are used to implement user-specified functions, leaving a significant amount of unused components. In some embodiments of the present invention, these unutilized programmable resources may be used to provide additional decoupling capacitance.

Figure 4:
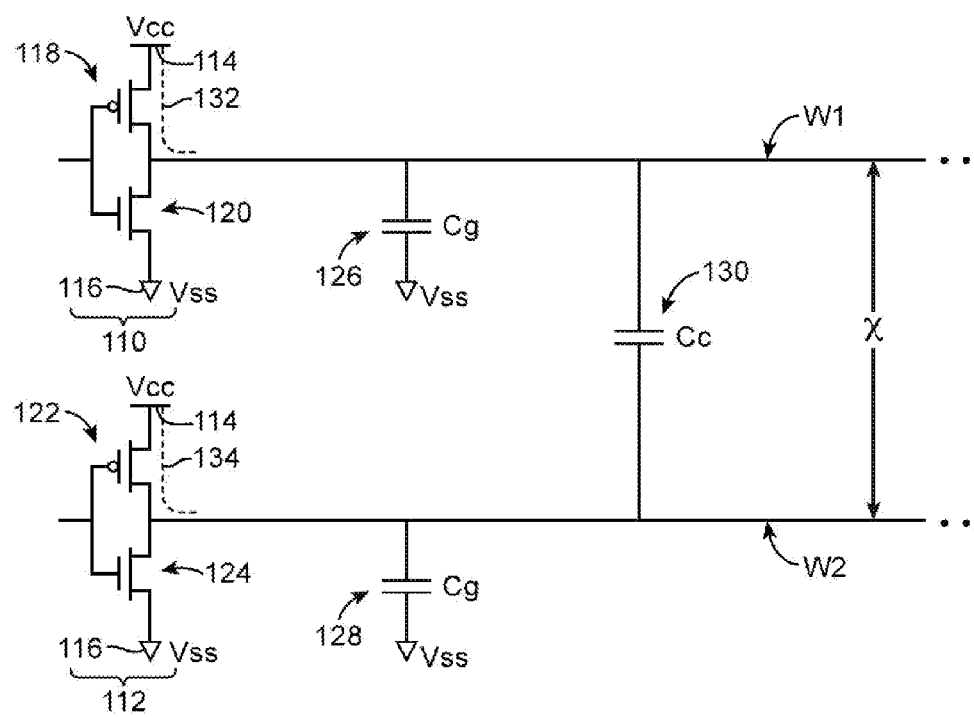
FIG. 4 is a diagram showing capacitances associated with adjacent configurable routing paths in accordance with an embodiment of the present invention.

FIG. 4 is a diagram of two illustrative adjacent unused routing paths (e.g., paths W1 and W2). Routing paths such as these can be fairly long (e.g., more than 10 µm, more than 50 µm, more than 100 µm, etc.) and can therefore be used to provide additional capacitance.

As shown in FIG. 4, path W1 may be driven using driver 110, whereas path W2 may be driven using driver 112. Routing path drivers 110 and 112 may be inverters (as an example). Driver 110 may include a p-channel transistor 118 and an n-channel transistor 120 coupled in series between a positive power supply line 114 (e.g., a first power supply line on which a positive power supply voltage Vcc is provided) and a ground power supply line 116 (e.g., a second power supply line on which a ground power supply voltage Vss is provided). Driver 112 may include a p-channel transistor 122 and an n-channel transistor 124 coupled in series between positive power supply line 114 and ground power supply line 116.

In one suitable arrangement, drivers 110 and 112 may respectively drive paths W1 and W2 to Vcc. In this scenario, each wire will exhibit a parasitic capacitance to ground. In the example of FIG. 4, capacitor 126 having a capacitance value of Cg may represent a lumped parasitic capacitance that is coupled between unused routing path W1 and ground (i.e., all capacitance that exists between path W1 and ground has a collectively value of Cg), whereas capacitor 128 having a capacitance value of Cg may represent a lumped parasitic capacitance coupled between unused routing path W2 and ground (i.e., all capacitance that exists between path W2 and ground has a collectively value of Cg). This is merely illustrative. The lumped parasitic capacitance Cg associated with W1 need not be equal to the lumped parasitic capacitance Cg associated with W2. Capacitor 130 having a capacitance value of Cc represents a lumped wire coupling capacitance interposed between the two adjacent routing paths. Routing paths W1 and W2 may sometimes be described herein as data routing paths, but may in general be other types of signal routing paths configured to carry clock signals and other control signals. When both paths W1 and W2 are driven to Vcc, the coupling capacitance between wires W1 and W2 will not be charged and hence will not contribute to the total decoupling capacitance. As a result, the total decoupling capacitance provided by these two paths will be equal to 2*Cg, because capacitor 130 does not contribute to the total decoupling capacitance. In this scenario, capacitor 126 associated with path W1 is coupled to power supply line 114 via pull-up transistor 118 (as indicated by dotted path 132), whereas capacitor 128 associated with path W2 is coupled to power supply line 114 via pull-up transistor 122 (as indicated by dotted path 134).

In another suitable arrangement, driver 110 may drive path W1 to Vcc while driver 112 may drive path W2 to Vss. In this scenario, capacitors 126 and 130 will contribute to the decoupling capacitance. Both terminals of capacitor 128 are shorted to ground and therefore do not contribute to the total decoupling capacitance. Path W2 that is driven to Vss effectively provides a ground path for coupling capacitor 130. In this scenario, coupling capacitance Cc may provide substantial capacitance. Paths W1 and W2 are separated by a distance X. As integrated circuit technology advances, distance X between adjacent routing paths tends to decrease. As a result, wire coupling capacitance Cc will increase and may sometimes be even greater than capacitance Cg. In scenarios in which path W2 is driven to ground, the total decoupling capacitance provided by these two paths will be equal to the sum of Cg (associated with path W1) and Cc. It may therefore be desirable to be able to identify situations where Cc is greater than Cg (associated with path W2), and in response to identifying such situations, to drive a first of two adjacent paths to Vcc and to drive a second of the two adjacent paths to Vss. If Cc is less than Cg (associated with path W2), the two adjacent paths may both be driven to Vcc as previously described.

Figure 5:
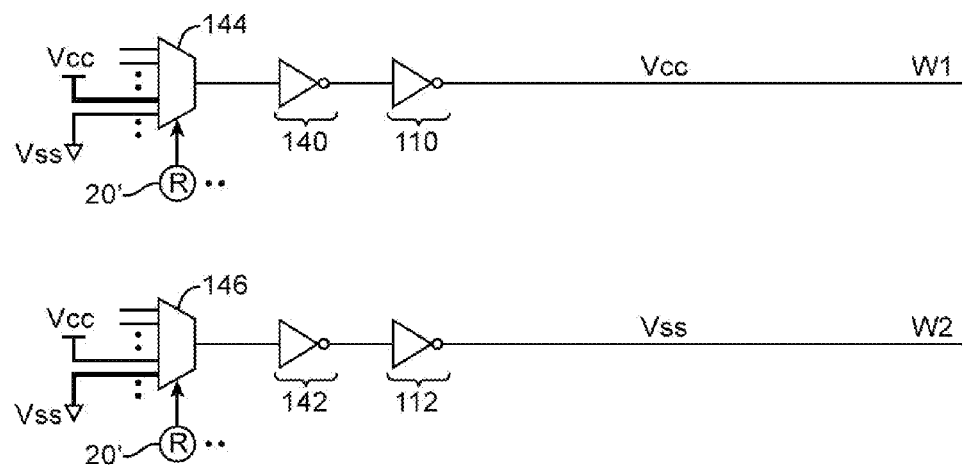
FIG. 5 is a diagram showing the routing paths coupled to power supply lines in accordance with an embodiment of the present invention.

FIG. 5 is a diagram showing the routing paths being coupled to power supply lines through the use of memory bit control. As shown in FIG. 5, path W1 may be coupled to multiplexer 144 via drivers 110 and 140, whereas path W2 may be coupled to multiplexer 146 via drivers 112 and 142. Multiplexers 144 and 146 may each be, as an example, a 32:1 multiplexer (i.e., a multiplexer having 32 inputs and one output) and may each have a control input that is controlled by a storage element such as storage element 20'. Storage element 20' may be a volatile memory element (e.g., a CRAM cell loaded with configuration data) or a nonvolatile memory element (e.g., a fuse, antifuse, electrically-programmable read-only memory element, etc.).

Storage element 20' associated with multiplexer 144 may or may not store the same value as storage element 20' associated with multiplexer 146. Storage element 20' may provide programmable control bits that determine which one of the multiplexer input signals gets routed to the output. For example, if the control bits stored in element 20' are equal to "00000," the signal presented at the first input of a 32:1 multiplexer will be routed to its output. If the control bits are equal to "00011," the signal presented at the fourth input of the multiplexer will be routed to its output. If the control bits are equal to "10010," the signal presented at the $19^{th}$ input of the multiplexer will be routed to its output.

Multiplexers 144 and 146 may each have a first dedicated input configured to receive positive power supply voltage Vcc and a second dedicated input configured to receive ground power supply voltage Vss. In the example of FIG. 5, storage element 20' associated with multiplexer 144 may store a first set of predetermined control bits that configure multiplexer 144 to route Vcc to its output, thereby driving path W1 to Vcc. Storage element 20' associated with multiplexer 146 may store a second set of predetermined control bits that configure multiplexer 146 to route Vss to its output, thereby driving path W2 to Vss. This way of forcing the unused routing paths to desired voltage levels may be referred to herein as CRAM control (e.g., assuming elements 20' are CRAM memory cells). As another example, path W2 may instead be driven to Vcc (e.g., by configuring multiplexer 146 to route Vcc to its output). If desired, each unused routing path may be selectively driven to Vcc, Vss, or any other desired voltage level.

Figure 6:
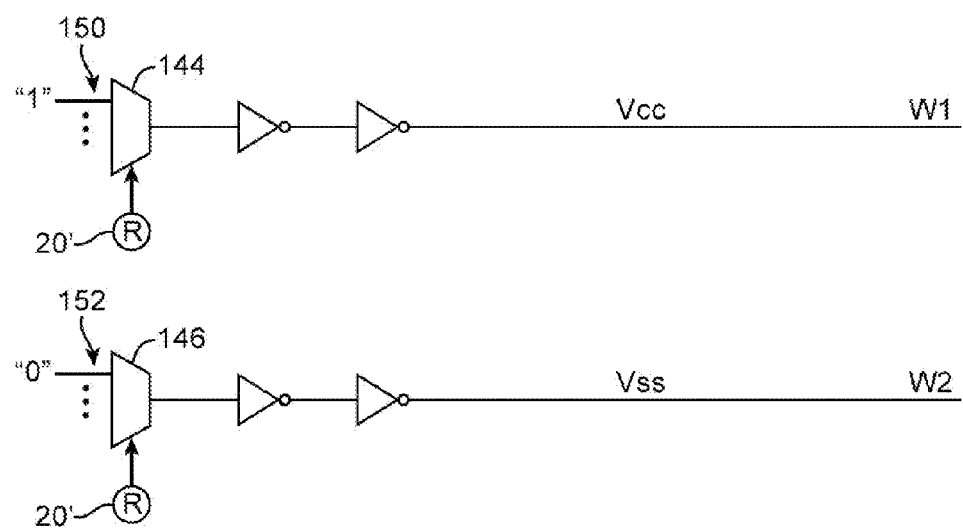
FIG. 6 is a diagram showing the routing paths driven to predetermined data values in accordance with an embodiment of the present invention.

In another suitable embodiment of the present invention, multiplexers 144 and 146 may be configured to propagate desired data values (see, e.g., FIG. 6). In the example of FIG. 6, a data value of "1" is presented at a selected input of multiplexer 144, whereas a data value of "0" is presented at a selected input of multiplexer 146. Each of multiplexers 144 and 146 may be configured to couple its selected input to its output so that paths W1 and W2 are driven to Vcc and Vss, respectively (e.g., storage elements 20' are programmed to store proper control bits such that the data values are passed through the multiplexers). This way of forcing the unused routing paths to desired voltage levels may be referred to herein as data control, because the multiplexers are passing actual data signals that have been generated by other programmable logic circuitry. As another example, path W2 may instead be driven to Vcc (e.g., by providing a data value of "1" at the selected input of multiplexer 146). If desired, each unused routing path may be selectively driven to Vcc, Vss, or any other desired voltage level using this approach.

Figure 7:
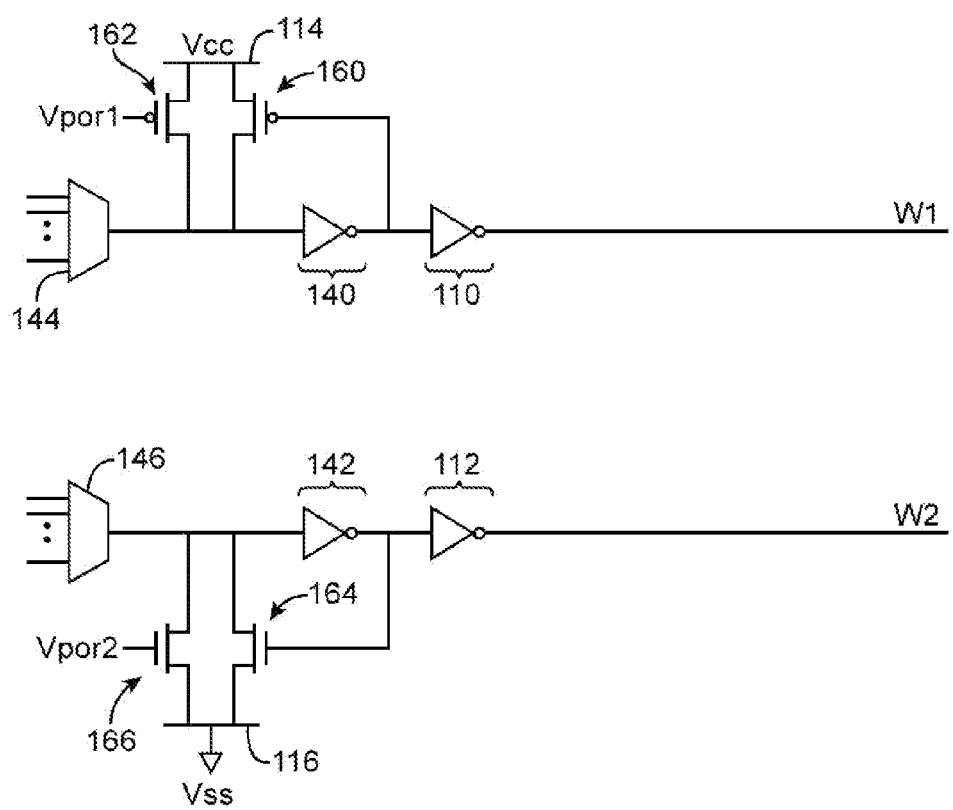
FIG. 7 is a diagram showing the routing paths reset to desired voltage levels using associated power-on-reset circuitry in accordance with an embodiment of the present invention.

In another suitable embodiment of the present invention, reset and keeper circuitry may be coupled to the routing paths to set the routing paths to default values upon power-up (see, e.g., FIG. 7). In the example of FIG. 7, p-channel transistors 162 and 160 may be coupled between positive power supply line 114 and the input of inverter 140. Transistor 162 may have a gate that is controlled by a first power-on-reset signal Vpor1, whereas transistor 162 may have a gate that is coupled to the output of inverter 140. Signal Vpor1 may be asserted during power-on-reset operations (e.g., Vpor1 may be pulsed low) to pull the input of inverter 140 to a default high value, thereby driving routing path W1 to Vcc. In response to raising the input of inverter 140, the output of inverter 140 is driven low. Once the output of inverter 140 is driven low, transistor 160 is turned on and may serve to keep routing path W1 biased high even after Vpor1 is deasserted.

N-channel transistors 166 and 164 may be coupled between the input of inverter 142 and ground power supply line 116. Transistor 166 may have a gate that is controlled by a second power-on-reset signal Vpor2, whereas transistor 164 may have a gate that is coupled to the output of inverter 142. Signal Vpor2 may be asserted during power-on-reset operations (e.g., Vpor2 may be pulsed high) to pull the input of inverter 142 to Vss. In response to lowering the input of inverter 142, the output of inverter 142 is driven high. Once the output of inverter 140 is driven high, transistor 164 is turned on and may serve to keep routing path W2 biased low even after Vpor2 is deasserted.

Transistors that are controlled using power-on-reset signals (e.g., Vpor1, Vpor2, etc.) such as transistors 162 and 166 may be referred to collectively as reset transistors (e.g., transistor 162 may be referred to as a pull-up reset circuit while transistor 166 may be referred to as a pull-down reset circuit), because they are only switched into use temporarily when device 10 is powered on. Transistors that are coupled to the routing paths in a feedback configuration such as transistors 160 and 164 may be referred to collectively as keeper transistors (e.g., p-channel transistor 160 may be referred to as a pull-up keeper while n-channel transistor 164 may be referred to as a pull-down keeper), because they serve to keep the routing paths driven to the default reset values during normal operation. This way of forcing the unused routing paths to desired voltage levels may be referred to herein as default settings control, because the routing paths are respectively set to desired default values during device startup. If desired, each routing path may be coupled to both pull-up and pull-down reset circuits and to both pull-up and pull-down keeper circuits so that each routing path may be selectively driven to Vcc, Vss, or any other desired voltage level.

Figure 8:
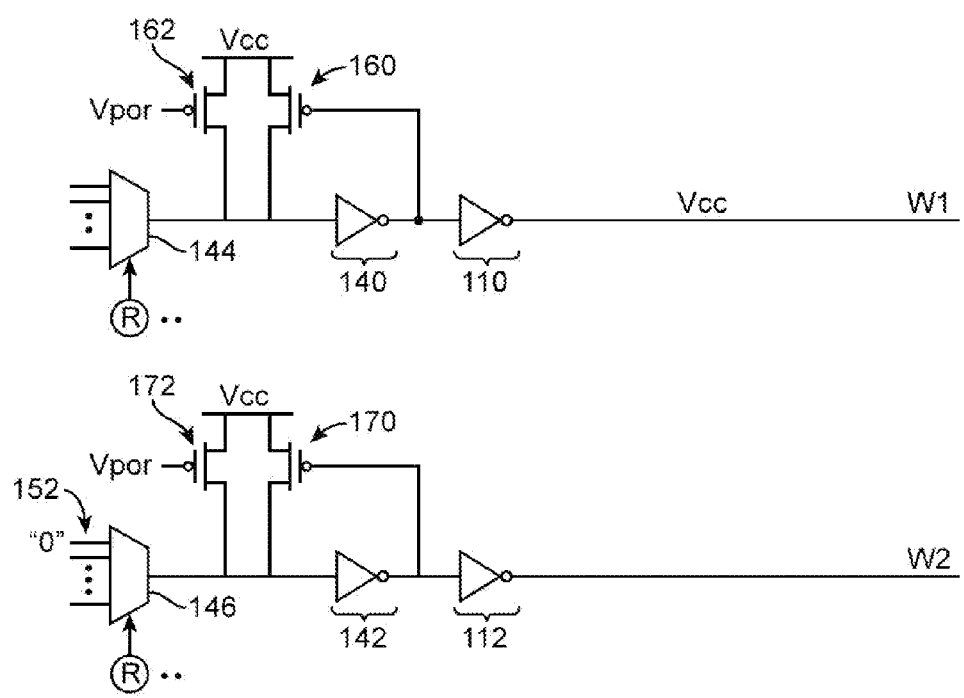
FIG. 8 is a diagram showing the routing paths driven to desired voltage levels using a combination of techniques shown in connection with FIGS. 6 and 7 in accordance with an embodiment of the present invention.

The different approaches described in connection with FIGS. 5, 6, and 7 may be used in any suitable combination. FIG. 8 shows how default settings control may be combined with data control for driving routing paths W1 and W2 to desired voltage levels. As shown in FIG. 8, each of the two adjacent routing paths may be coupled to pull-up reset circuitry and pull-up keeper circuitry. In the example of FIG. 8, transistors 162 and 160 may be used to set the voltage level of routing path W1 to a default level of Vcc. Similarly, reset transistor 172 may be used to set the voltage level of routing path W2 to Vcc. Reset transistors 162 and 172 may have gate terminals that are controlled using power-on-reset control signal Vpor. After signal Vpor has been deasserted, a desired data value of "0" may be presented at a selected input 152 of multiplexer 146. Multiplexer 146 may be configured to route the desired data value to its output, thereby driving the input of inverter 142 low. In response to the input of inverter 142 falling low, the output of inverter 142 will be driven high to deactivate pull-up keeper 170. As a result, routing path W2 will be driven to Vss. If desired, routing path W2 may be kept at the default high setting in scenarios where coupling capacitance Cc is less than parasitic wire-to-ground capacitance Cg (e.g., proper data propagation need not be used). If desired, default settings control may also be used in conjunction with CRAM control to eliminate the need for multiple dedicated multiplexer inputs being connected to power supply lines.

Figure 9:
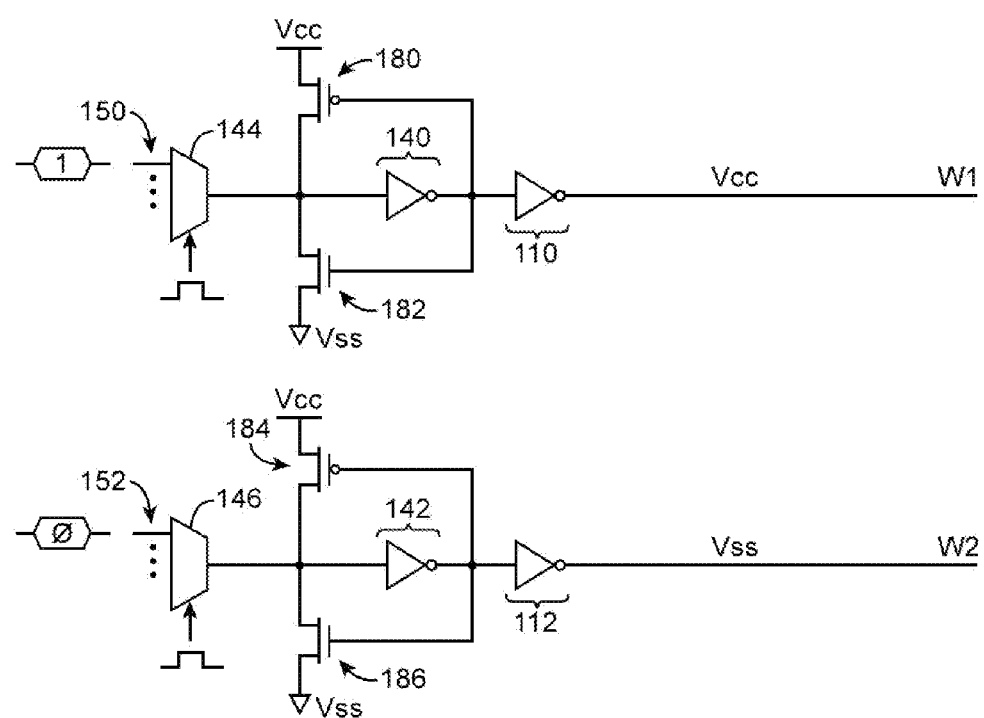
FIG. 9 is a diagram showing the routing paths driven to desired voltage levels by temporarily providing desired data values to the routing paths and by using associated keeper circuits in accordance with an embodiment of the present invention.

In another suitable embodiment of the present invention, the routing paths may each be coupled to pull-up and pull-down keeper circuits (e.g., reset circuitry need not be used). As shown in FIG. 9, p-channel keeper transistor 180 may have a source terminal that is coupled to the positive power supply line, a drain terminal that is coupled to the input of inverter 140, and a gate terminal that is coupled to the output of inverter 140. N-channel keeper transistor 182 may have a drain terminal that is coupled to the input of inverter 140, a source terminal that is coupled to the ground power supply line, and a gate terminal that is coupled to the output of inverter 140. Pull-up keeper 180 may serve to keep routing path W1 high when the output of inverter 140 is driven low, whereas pull-down keeper 182 may serve to keep routing path W1 low when the output of inverter 140 is driven high.

Similarly, p-channel keeper transistor 184 may have a source terminal that is coupled to the positive power supply line, a drain terminal that is coupled to the input of inverter 142, and a gate terminal that is coupled to the output of inverter 142. N-channel keeper transistor 186 may have a drain terminal that is coupled to the input of inverter 142, a source terminal that is coupled to the ground power supply line, and a gate terminal that is coupled to the output of inverter 142. Pull-up keeper 184 may serve to keep routing path W2 high when the output of inverter 142 is driven low, whereas pull-down keeper 186 may serve to keep routing path W2 low when the output of inverter 142 is driven high.

In the example of FIG. 9, routing paths W1 and W2 are not coupled to any reset circuitry. As a result, there needs to be a way for initializing the routing paths to the desired voltage levels. One way of accomplishing this without the use of reset transistors is to temporarily activate respective multiplexers 144 and 146 to pass through desired data values. For example, a logic value of "1" may be momentarily presented at input 150 of multiplexer 144, whereas a logic value of "0" may be momentarily presented at input 152 of multiplexer 146. Multiplexers 144 and 146 may be momentarily enabled to pass those values to bias routing paths W1 and W2 to appropriate voltage levels (e.g., to drive W1 to Vcc and to drive W2 to Vss). Multiplexers 144 and 146 may then be disabled. The pull-up and pull-down keeper circuits may help maintain routing paths W1 and W2 at Vcc and Vss, respectively, after the multiplexers have been turned off. If desired, each unused routing path may be selectively driven to Vcc, Vss, or any other desired voltage level using this approach.

Figure 10:
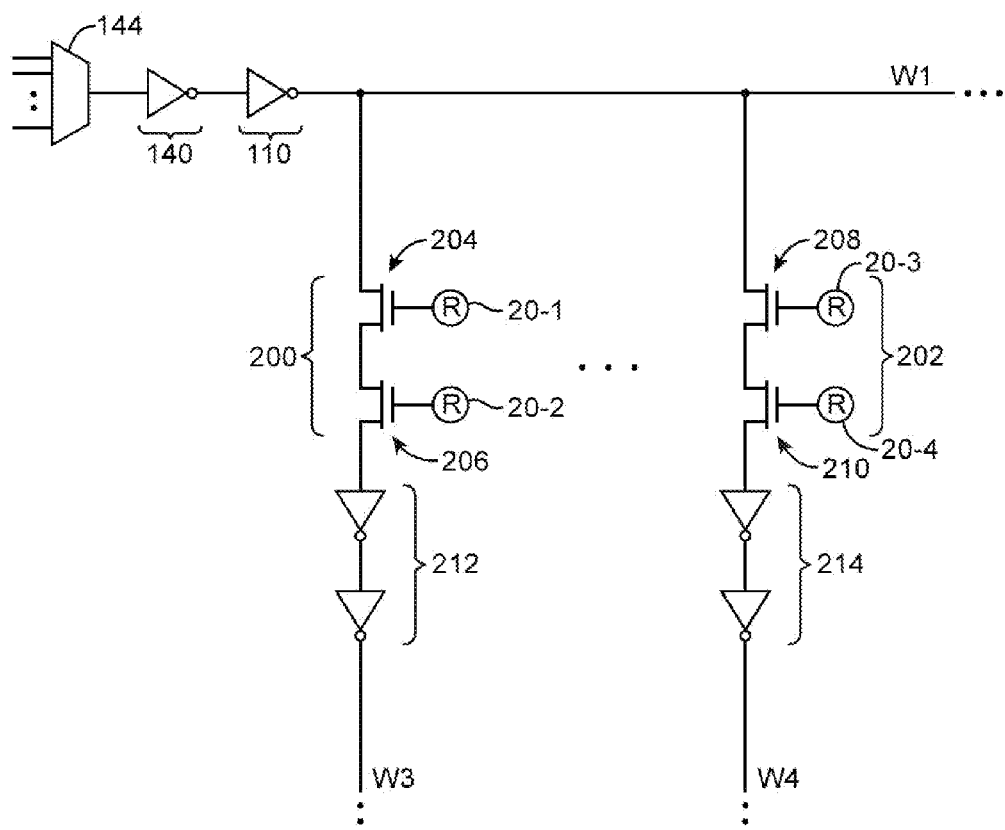
FIG. 10 is a diagram showing switching circuits that are coupled to an unused routing path to provide increased capacitive loading in accordance with an embodiment of the present invention.

In general, it may be desirable to further increase parasitic wire-to-ground capacitance Cg for increasing the total decoupling capacitance. One way of increase Cg is to introduce additional loading components onto an unused routing path. In general, each routing path may be coupled to additional branching (or fan-out) routing paths via switchable circuits (see, e.g., FIG. 10). As shown in FIG. 10, routing path W1 may be coupled to first branching routing path W3 via multiplexer 200 and buffer circuits 212 and may be coupled to second branching routing path W4 via multiplexer 208 and buffer circuits 214. Multiplexer 200 may include at least pass transistors 204 and 206 coupled in series between W1 and W3. Transistors 204 and 206 may have gates that are controlled by bits stored on memory elements 20-1 and 20-2, respectively. Multiplexer 202 may include at least pass transistors 208 and 210 coupled in series between W1 and W4. Transistors 208 and 210 may have gates that are controlled by bits stored on memory elements 20-3 and 20-4, respectively.

Assume in this example that routing wire W1 is driven to Vcc using at least one of the methods described in FIGS. 5-9. One way of increasing Cg associated with W1 is to turn on at least some of the pass transistors (or any other switching circuitry) that are coupled to wire W1. For example, pass transistors 204 and 208 may be turned on by configuring memory elements 20-1 and 20-3 to store logic high data bits. As another example, pass transistors, 208 and 210 may be turned on by configuring memory elements 20-3 and 20-4 to store logic ones. As another example, pass transistors 204, 206, 208, and 210 may be turned on by respectively configuring memory elements 20-1, 20-2, 20-3, and 20-4 to store logic ones. The example of FIG. 10 in which two fan-out paths are shown is merely illustrative and does not serve to limit the scope of the present invention. There may be any number of additional routing paths and switchable circuits branching off each unused routing path.

In scenarios in which parasitic wire-to-ground capacitance Cg dominates coupling capacitance Cc (i.e., in situations where Cg is substantially greater than Cc), each of two adjacent wires W1 and W2 may be driven to Vcc and the multiplexers associated with the branching routing paths coupled to W1 and W2 may be turned on to increase Cg. In scenarios in which parasitic wire-to-ground capacitance Cg is less than coupling capacitance Cc (i.e., in situations where Cg is substantially less than Cc), wire W1 may be driven to Vcc while wire W2 may be driven to Vss (or vice versa). The multiplexers associated with the branching routing paths coupled to W1 may be turned on to increase Cg (as an example).

In general, each programmable routing path on a programmable integrated circuit 10 may include associated reset and/or keeper circuitry for use in driving the unused routing paths to desired voltage levels for optimal decoupling capacitance. Certain portions of device 10 may be identified as being utilized to implement user-specified custom logic functions while other portions of device 10 may be identified as being unutilized/idle using computer-aided design (CAD) tools in a logic design system when designing a custom logic circuit (see, e.g., FIG. 11). Design tools 62 may be implemented on computing equipment (e.g., a personal computer).

The design process typically starts with the formulation of logic circuit functional specifications. An integrated circuit designer can specify how a desired circuit should function using design and constraint entry tools 64. Design and constraint entry tools 64 may include tools such as design and constraint entry aid 66 and design editor 68. Design and constraint entry aids such as aid 66 may be used to help a designer locate a desired design from a library of existing designs and may provide computer-aided assistance to the designer for entering (specifying) the desired design. As an example, design and constraint entry aid 66 may be used to present screens of options for a user. The user may click on on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

If desired, design and constraint entry tools 64 may allow the designer to provide a logic design using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.).

Once the functional operation of the logic design has been determined to be satisfactory, logic synthesis and optimization tools 74 may be used to implement the logic design in a particular integrated circuit (i.e., in the logic and interconnect resources of a particular programmable integrated circuit product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, placement and routing tools 76 may be used to perform physical design steps (layout synthesis operations). Placement and routing tools 76 are used to determine how to place the circuits for each logic function within device 10. For example, if two counters interact with each other, the placement and routing tools 76 may locate these counters in adjacent logic regions on the integrated circuit to minimize interconnect delays. The placement and routing tools 76 create orderly and efficient implementations of logic designs for a given integrated circuit.

After an implementation of the desired logic design in device 10 has been generated using placement and routing tools 76, the implementation of the design may be analyzed and tested using analysis tools 78.

Design tools 62 may be used identify unused portions of device 10 (i.e., to identify unused routing resources on a programmable integrated circuit). In particular, design tools 62 may be capable of analyzing an adjacent pair of routing paths and to determine whether to drive both wires to Vcc or to drive one wire to Vcc and the other to Vss (e.g., tools 62 may be capable to determining whether decoupling capacitance is potentially greater than the parasitic wire to ground capacitance Cg, assuming that all fan-out multiplexers are turned on).

Figure 12:
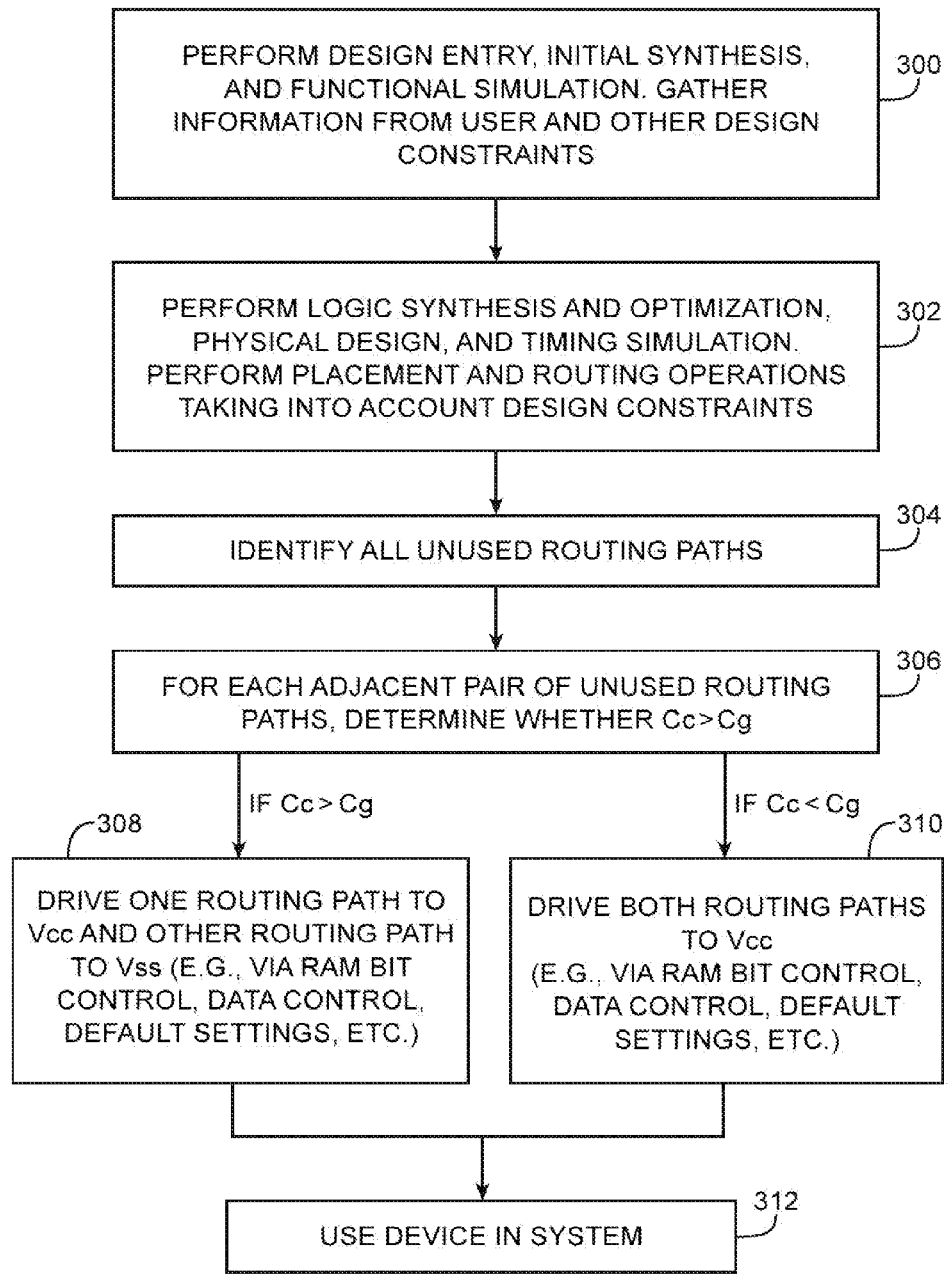
FIG. 12 is a flow chart of illustrative steps for configuring unused routing paths on a programmable integrated circuit to provide increased decoupling capacitance in accordance with an embodiment of the present invention.

FIG. 12 is a flow chart of illustrative steps for configuring unused routing paths on programmable integrated circuit 10 to provide increased decoupling capacitance. At step 300, tools such as design and constraint entry tools 64 use input screens to obtain the desired custom logic design from the logic designer. The design includes design constraints such as timing constraints, signal strength constraints, logic function constraints, etc. A settings screen and/or other suitable user input arrangements are used to gather user settings related to identifying one or more appropriate memory element power supply levels. If desired, some or all settings may be provided as defaults.

During step 300, the user can specify constraints such as delay or speed limits, desired memory element power supply voltages, current drive limits, noise level limits, core voltage settings, I/O voltage settings, etc. For example, a user may specify a requirement or preference that a particular circuit path operate at a particular minimum speed or maximum delay. If desired, settings such as these may be provided as defaults (e.g., when a user does not specify any such constraints).

Figure 11:
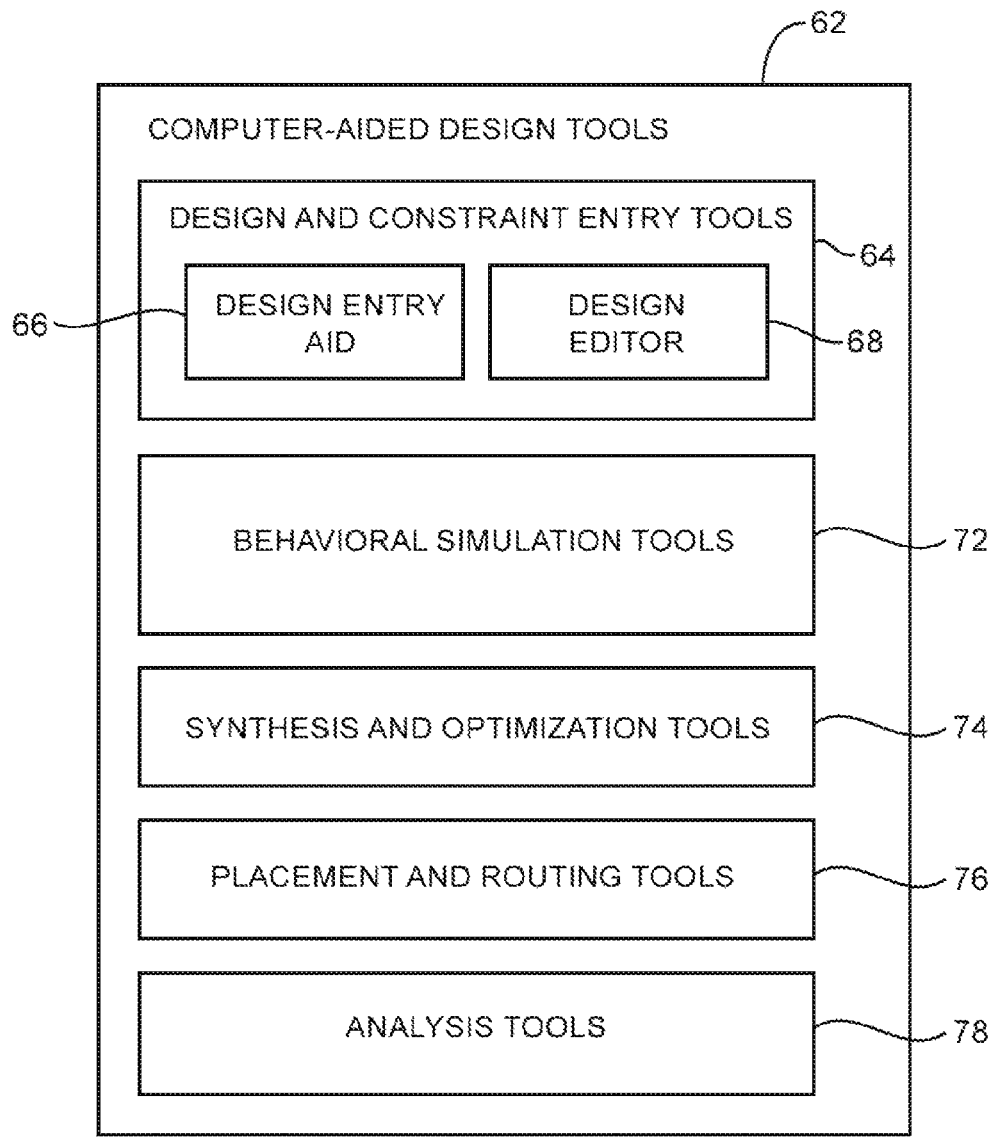
FIG. 11 is a diagram of illustrative computer-aided design (CAD) tools that may be used in a logic design system in accordance with an embodiment of the present invention.

At step 302, logic synthesis and optimization, physical design, and timing simulation operations may be performed using tools 72, 74, 76, and 78 of FIG. 11. During these operations, tools 64 may process the design constraints and memory element power supply level settings obtained at step 300 to produce a design implementation for integrated circuit 10. Design tools 62 may allocate resources and perform placement operations that ensure that the implementation of the desired custom logic circuit satisfies design constraints. During step 300, design tools 62 may produce corresponding configuration data for programming integrated circuit 10. Integrated circuit 10 may be programmed with the configuration data produced during step 300 at step 302.

At step 304, design tools 62 may be used to identify all the unused routing resources (e.g., unused routing paths). For each adjacent pair of unused routing paths, design tools 62 may be used to determine whether the maximum potential wire coupling capacitance Cc exceeds the maximum potential parasitic wire-to-ground capacitance Cg. If Cc exceeds Cg, the two routing paths may be driven to Vcc and Vss, respectively, as shown in step 308 (e.g., via RAM bit control of the type described in connection with FIG. 5, data control of the type described in connection with FIG. 6, default settings control of the type described in connection with FIG. 7, and/or suitable routing path biasing approaches). If Cc is less than Cg, the two routing paths may both be driven to Vcc, as shown in step 310 (e.g., using any combination of approaches described in connection with FIGS. 5-9). Once the unused routing paths have been properly configured to provide sufficient decoupling capacitance, device 10 may be placed in normal operation for use in a system to provide the desired custom logic function (step 312). During normal operation, the keeper circuitry (if present) may be used to ensure that the routing paths are held at fixed power supply voltage levels.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
    first and second adjacent signal routing paths;
    a first driver circuit configured to drive the first signal routing path to a first fixed power supply voltage level;
    a second driver circuit configured to drive the second signal routing path to a second fixed power supply voltage level that is different than the first fixed power supply voltage level, wherein the first and second signal routing paths at the first and second respective fixed power supply voltage levels are configured to contribute a capacitance to decoupling capacitance;
    a first multiplexing circuit having an output that is coupled to the first driver circuit; and
    a second multiplexing circuit having an output that is coupled to the second driver circuit.

2. The integrated circuit defined in claim 1 further comprising:
    a power supply having first and second terminals, wherein the decoupling capacitance is coupled across the first and second terminals of the power supply.

3. The integrated circuit defined in claim 1,
    wherein the first multiplexing circuit also has a first input that is coupled to a first power supply line that is driven to the first fixed power supply voltage level, wherein the first multiplexing circuit is configured to couple its first input to its output,
    wherein the second multiplexing circuit also has a first input that is coupled to a second power supply line that is driven to the second fixed power supply voltage level, and wherein the second multiplexing circuit is configured to couple its first input to its output.

4. The integrated circuit defined in claim 3, wherein the first multiplexing circuit also includes a second input that is coupled to the second power supply line, and wherein the second multiplexing circuit also includes a second input that is coupled to the first power supply line.

5. The integrated circuit defined in claim 1,
    wherein the first multiplexing circuit also has a selected input operable to receive a first data signal exhibiting the first fixed power supply voltage level, wherein the first multiplexing circuit is configured to route the first data signal from its selected input to its output,
    wherein the second multiplexing circuit also has a selected input operable to receive a second data signal exhibiting the second fixed power supply voltage level, and wherein the second multiplexing circuit is configured to route the second data signal from its selected input to its output.

6. The integrated circuit defined in claim 1, further comprising:
    a reset circuit that is coupled to the first signal routing path, wherein the reset circuit is operable to set the first signal routing path to the first fixed power supply voltage level in response to asserting a control signal that controls the reset circuit.

7. The integrated circuit defined in claim 6, further comprising:
    a keeper circuit that is coupled to the first signal routing path, wherein the keeper circuit is operable to maintain the first signal routing path at the first fixed power supply voltage level when the control signal is deasserted.

8. The integrated circuit defined in claim 1, further comprising:
    a first transistor coupled between a first power supply line that is driven to the first fixed power supply voltage level and an input of the first driver circuit, wherein the first transistor has a gate that is coupled to an output of the first driver circuit; and
    a second transistor coupled between a second power supply line that is driven to the second fixed power supply voltage level and the input of the first driver circuit, wherein the second transistor has a gate that is coupled to the output of the first driver circuit.

9. The integrated circuit defined in claim 1, further comprising:
    third and fourth adjacent signal routing paths on the integrated circuit;
    a third driver circuit configured to drive the third signal routing path to the first fixed power supply voltage level; and
    a fourth driver circuit configured to drive the fourth signal routing path to the first fixed power supply voltage level, wherein the third and fourth signal routing paths at the first fixed power supply voltage level are configured to contribute a capacitance to the decoupling capacitance, and wherein the first, second, third, and fourth signal routing paths comprise paths selected from the group consisting of: data signal routing paths, control signal routing paths, and clock signal routing paths.

10. The integrated circuit defined in claim 1, further comprising:
    at least one switchable circuit having a source-drain terminal that is coupled to the first signal routing path, wherein the switchable circuit is turned on to exhibit a transistor capacitance that contributes to the decoupling capacitance.

11. A programmable integrated circuit comprising:
programmable circuitry configured to implement a desired logic function;
at least one routing path that is unused in implementing the desired logic function and that exhibits a wire capacitance; and
at least one switchable circuit having a terminal that is coupled to the routing path, wherein the switchable circuit is turned on to exhibit a circuit capacitance, and wherein the wire capacitance and the circuit capacitance contribute at least some of a decoupling capacitance associated with a decoupling capacitor on the programmable integrated circuit.

12. The programmable integrated circuit defined in claim 11, further comprising:
a power supply having first and second terminals, wherein the decoupling capacitor is coupled across the first and second terminals.

13. The programmable integrated circuit defined in claim 11, further comprising:
a driver circuit coupled to the routing path, wherein the driver circuit is operable to drive the routing path to a fixed power supply voltage level.

14. The programmable integrated circuit defined in claim 13, wherein the at least one switchable circuit comprises at least one pass transistor, the programmable circuit further comprising:
a multiplexing circuit coupled to the routing path via the driver circuit.

15. The programmable integrated circuit defined in claim 14, further comprising:
reset circuitry coupled to the routing path, wherein the reset circuitry configures the driver circuit to drive the routing path to the fixed power supply voltage level during device startup operations; and
keeper circuitry coupled to the routing path, wherein the keeper circuitry ensures that the routing path is held at the fixed power supply voltage level during normal operation.

16. A method of using a logic design tool implemented on computing equipment to create a desired decoupling capacitance on a programmable integrated circuit, the method comprising:
with the logic design tool, identifying a first routing path on a programmable integrated circuit that is unused in implementing a custom logic function on the programmable integrated circuit;
with the logic design tool, identifying a second routing path that is adjacent to the first routing path and that is unused in implementing the custom logic function on the programmable integrated circuit; and
with the logic design tool, identifying first and second voltage levels at which the first and second routing paths are to be respectively driven to produce the desired decoupling capacitance on the programmable integrated circuit.

17. The method defined in claim 16, wherein identifying the first and second voltage levels comprises identifying first and second fixed voltage levels having the same voltage level.

18. The method defined in claim 16, wherein the identifying the first and second voltage levels comprises identifying a first fixed voltage level that is different than a second fixed voltage level.

19. The method defined in claim 16, further comprising:
identifying a pass transistor that is coupled to the routing path and that is designed to be turned on, wherein the pass transistor exhibits a transistor capacitance that contributes to the desired decoupling capacitance on the programmable integrated circuit.

20. The method defined in claim 16 wherein the first and second routing paths comprise first and second data routing paths that are unused in implementing the custom logic function on the programmable integrated circuit, the method further comprising:
identifying circuitry on the programmable integrated circuit that is used in implementing the custom logic function, wherein the circuitry includes data routing paths operable to convey time-varying data signals.

\* \* \* \* \*